United States Patent
Nishimura et al.

[11] Patent Number: 6,124,728
[45] Date of Patent: Sep. 26, 2000

[54] PROGRAMMABLE FUNCTIONAL DEVICE HAVING FERROELECTRIC MATERIAL

[75] Inventors: Kiyoshi Nishimura; Takaaki Fuchikami, both of Ukyo-ku, Japan

[73] Assignee: Rohm Co., Ltd., Kyoto, Japan

[*] Notice: This patent is subject to a terminal disclaimer.

[21] Appl. No.: 09/234,994

[22] Filed: Jan. 21, 1999

Related U.S. Application Data

[63] Continuation of application No. 08/700,107, Aug. 20, 1996, Pat. No. 5,896,042.

[30] Foreign Application Priority Data

Aug. 23, 1995 [JP] Japan ................................ 7-214919

[51] Int. Cl.[7] ................................................ H03K 19/173
[52] U.S. Cl. ................................................ 326/38; 326/47
[58] Field of Search ............................... 326/37, 38, 39, 326/41, 47; 365/145

[56] References Cited

U.S. PATENT DOCUMENTS

| | | |
|---|---|---|
| 4,870,302 | 9/1989 | Freeman ..................................... 326/41 |
| 5,198,706 | 3/1993 | Papaliolios ................................. 326/37 |
| 5,258,668 | 11/1993 | Cliff et al. ............................. 326/39 X |
| 5,434,811 | 7/1995 | Evans, Jr. et al. ....................... 365/145 |
| 5,457,410 | 10/1995 | Ting .......................................... 326/41 |
| 5,495,437 | 2/1996 | Tai et al. ................................. 365/145 |
| 5,592,411 | 1/1997 | Tai .......................................... 365/145 |
| 5,644,533 | 7/1997 | Lancaster et al. .................. 365/145 X |

Primary Examiner—Michael Tokar
Assistant Examiner—James H. Cho
Attorney, Agent, or Firm—Merchant & Gould P.C.

[57] ABSTRACT

A switch SW 11 comprises a ferroelectric memory 26 and an AND gate 28. A data input line L11 and an output terminal of the ferroelectric memory 26 are connected to an input terminal of the AND gate 28. Also, output terminal of the AND gate 28 is connected to an AND input line L21. In order to write the switching data which switches the state of the switch SW11 either in open state or closed state into the ferroelectric capacitor 26, ferroelectric capacitors C11 and C12 are polarized in opposite directions with each other. The polarization is carried out in short period, and the polarization state can be maintained even when the power is turned off. So that, the switching data can be written repeatedly by changing direction of the voltage applied to the ferroelectric capacitors C11 and C12.

16 Claims, 9 Drawing Sheets

PROGRAMMABLE FUNCTIONAL DEVICE HAVING FERROELECTRIC MATERIAL

This application is a Continuation of application Ser. No. 08/700,107, filed Aug. 20, 1996 now U.S. Pat. No. 5,896,042.

BACKGROUND OF INVENTION

1. Field of the Invention

This invention relates to a programmable functional device, more specifically to switches used for the programmable functional device.

2. Description of the Related Art

A programmable logic device (hereinafter referred to as PLD) is known as large scale integrated circuit(hereinafter referred to as LSI) capable of programming logic functions by the user(s). The PLD has a wide variety of devices such as a programmable logical array (hereinafter referred to as PLA) and a field programmable gate array (hereinafter referred to as FPGA). The PLA is an example of a small scale PLD having a basic structure consisting of an AND portion and an OR portion. Also, the FPGA is an example of a large scale PLD.

These PLDs are constructed so as to provide a number of logic circuits and the like on the chip for the LSI, and the logic circuits are connected to one another through switches capable of programming. So that, it is possible to realize desired logic functions by switching the switches in accordance with the programs programmed by the user(s).

Thus, an LSI having desired logic functions can be realized in a short period of time by utilizing the PLD.

However, the PLD in the prior art described in the above has the following disadvantages. A fuse 2 shown in FIG. 9A is used as a switch capable of programming in the prior art. Disconnection of a line 4 and a line 6 can be done by burning out the fuse 2. However, it is not possible to connect the fuse 2 again, once the fuse 2 has been burned out. So that, the logic functions can not be rewritten as a result of disconnection.

To resolve the problem stated in the above, an electrically erasable and programmable read only memory (hereinafter referred to as EEPROM) 8 shown in FIG. 9B can be used as the switch instead of the fuse 2. Although rewriting of the logic functions can be achieved as a result of using the EEPROM 8, it requires a long time to rewrite the logic functions. Therefore, the EEPROM 8 cannot be applied to a switch that needs to be operated under real-time bases.

In order to realize simulated rewriting of the logic functions under real-time bases while using the EEPROM 8, a method using two individual units each of which includes a certain numbers of logic circuits etc. (hereinafter, each of the unit is referred to as a tile) is proposed. In this method, a total of two tiles being twice the number of tiles used in regular operation are mounted, and rewriting of the logic functions is carried out one after another exclusively. In other words, the rewriting of one tile is carried out while the other tile is performing routine data processing as regularly executed by a PLD. Although the method allows the EEPROM 8 to prevent suspension of processing for long period of time when the rewriting is carried out, the area of the chip must be increased to twice as much for mounting the two tiles.

A static random access memory (hereinafter referred to as SRAM) 10 shown in FIG. 9C can be used in order to carry out rewriting of the logic functions under real-time bases. Although rewriting of the logic functions under real-time bases can be carried out by utilizing the SRAM 10, another non-volatile memory device is required to secure the contents of the rewriting because the SRAM is a volatile memory device.

OBJECT AND SUMMARY OF THE INVENTION

An object of the present invention is to provide a programmable functional device formed compactly while maintaining rewriting data, and to provide a programmable functional device which enables rewriting of the logic functions under real-time bases as well as resolve the disadvantages of the programmable functional device such as PLD in the prior art.

In accordance with characteristics of the present invention, a programmable functional device having a number of circuit elements preliminarily arranged and being connected to one another through a switching means capable of programming, the programmable functional device obtains desired functions by switching the switching means, wherein the programmable functional device uses a memory element having ferroelectric material as the switching means.

While the novel features of the invention are set forth in a general fashion, both as to organization and content, it will be better understood and appreciated, along with other objects and features thereof, from the following detailed description taken in conjunction with the drawings.

DETAILED DESCRIPTION OF THE PREFERRED EMBODIMENT

Figure 2:
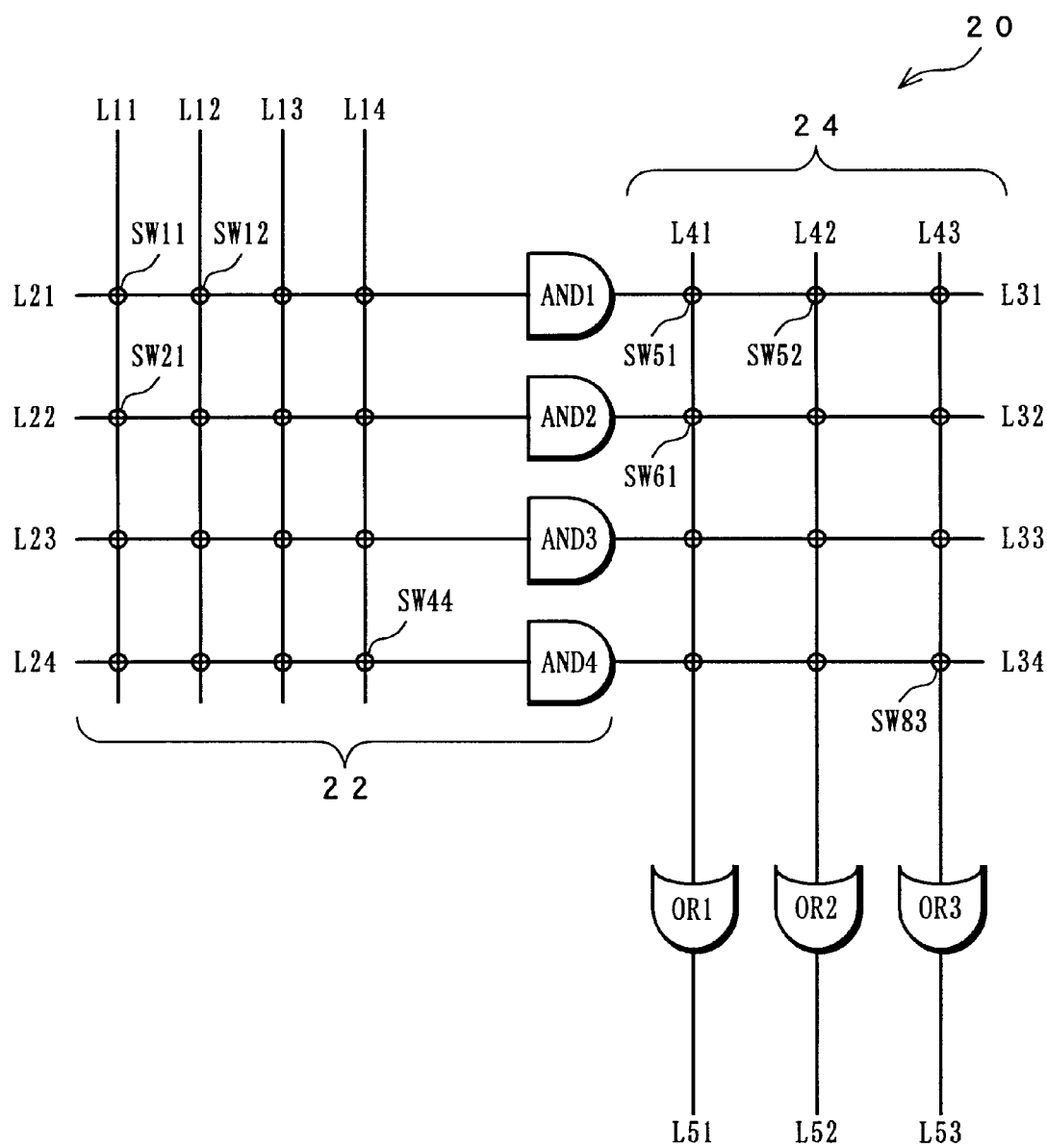
FIG. 2 is a typical view of a partial circuit diagram of a logical array which constructs the PLA in an embodiment of the present invention.

FIG. 2 is a typical view of the circuit diagram of a logical array 20 which constructs a PLA 12 (see FIG. 4) serving as a programmable functional device in an embodiment of the present invention. The PLA 12 has a relatively simple structure, and comprises an AND portion and an OR portion. FIG. 2 shows a partial circuit diagram of the logical array 20, picked up from the whole view of the circuit diagram for ease of explanation. So that, the logical array 20 actually used has a more complex structure.

In FIG. 2, the AND portion 22 comprises a total of four data input lines L11, L12, L13 and L14, four AND input lines L21, L22 L23 and L24, and a total of four AND gates AND1, AND2, AND3 and AND4, each of which serve as circuit elements.

A plurality of switches such as a switch SW11 to a switch SW44 are provided to a total of 16 interconnecting points made by the data input lines L11 to L14 and the AND input lines L21 to L24, both of which belong to the AND portion 22.

The OR portion 24 comprises a total of four AND output lines L31, L32, L32 and L34, three OR input lines L41, L42 and L43, a total of three OR gate OR1, OR2 and OR3, and three OR output lines L51, L52 and L53, each of which serve as circuit elements.

In the same manner as the AND portion, a plurality of switch such as a switch SW51 to a switch SW83 are provided to a total of 12 interconnecting points made by the AND output lines L31 to L34 and the OR input lines L41 to L43, both which belong to the OR portion 24.

Although, a total of four AND gates AND1, AND2, AND3 and AND4, and three OR gates OR1, OR2 and OR3 are used in FIG. 2 for reasons of convenience of explanation, a total of seven NAND gates are used instead of these gates in an actual circuit in order to realize a circuit which is logically equivalent to the circuit shown in FIG. 2.

Figure 1:
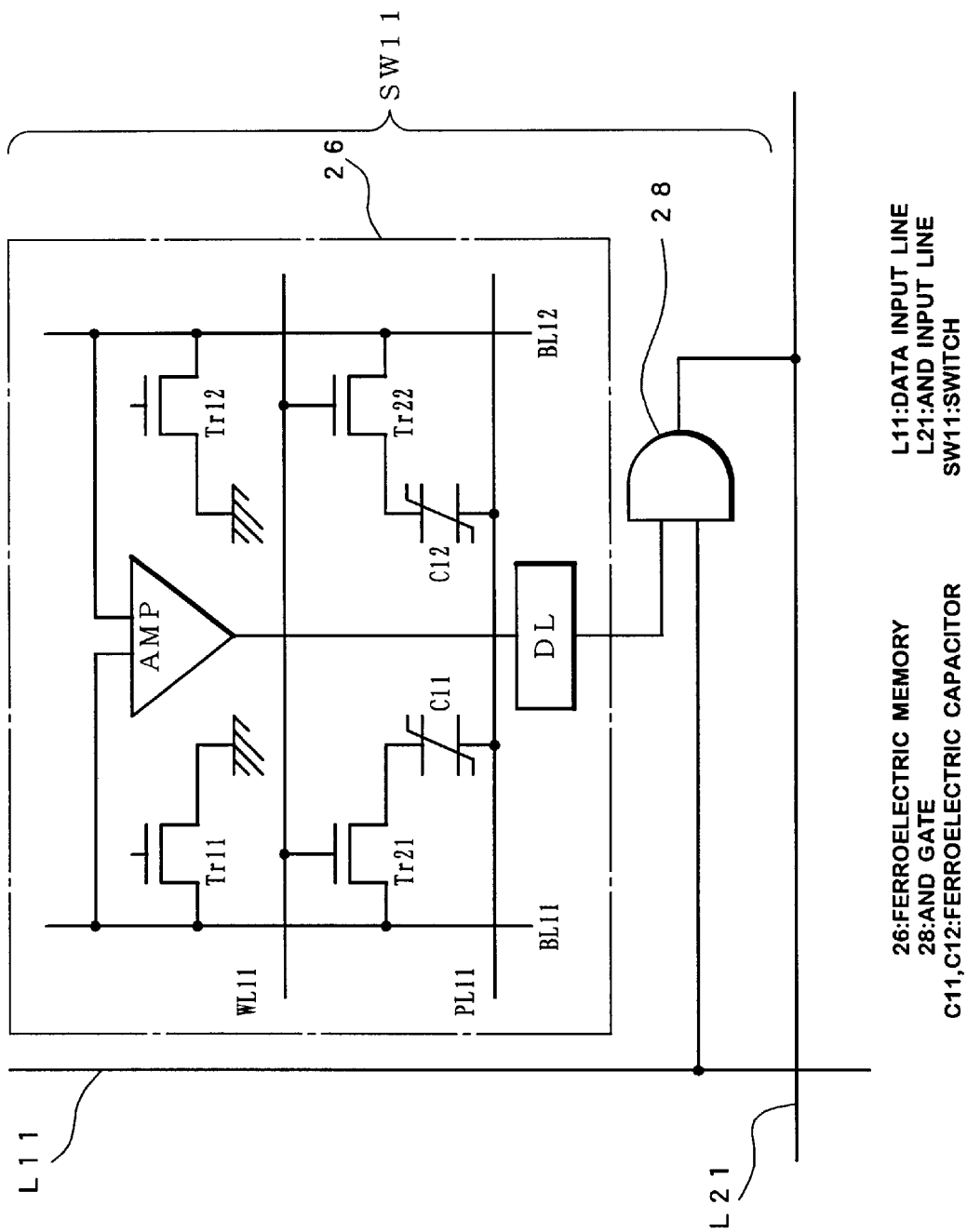
FIG. 1 is an enlarged circuit diagram of a switch used for a logical array which constructs a PLA in an embodiment of the present invention.

FIG. 1 shows an enlarged circuit diagram of the switch SW11. The switch SW 11 comprises a ferroelectric memory 26 serving as a ferroelectric memory element having a ferroelectric capacitor and an AND gate 28.

The ferroelectric memory 26 has a common structure, such as comprising a total of four transistors, a transistor Tr11 to Tr22, a total of two ferroelectric capacitors, a ferroelectric capacitor C11 and C12, a sensing amplifier AMP and a data latch DL. For instance, the ferroelectric memory 26 has the equivalent structure of a ferroelectric memory stated on page 290 to page 292 in a publication entitled "A ferroelectric thin film memory" (issued on Jun. 30, 1995 by the science-forum Co. LTD.).

Both the data input line L11 and an output terminal of the ferroelectric memory 26 are connected to an input terminal of the AND gate 28, and an output terminal of the AND gate 28 is connected to the AND input line L21.

Next, operation of the switch SW11 is described hereinbelow referring to FIG. 1. Operation of the ferroelectric memory 26 which constructs the switch SW11 is commonly known, and detailed operation is described in the publication mentioned in the above.

First, the operation for writing (rewriting) of the switching data is described. When switching data which switches the state of the switch SW11 to either an open state or a closed state is written into the ferroelectric capacitor 26, the level of desired switching data (for instance, "High" is given when the switch SW11 is switched to the closed state) is provided to a bit line BL11 and an exclusive logic value of the level of the desired switching data (in this case, "Low") is given to a bit line BL12.

Further, both the transistor Tr21 and the transistor Tr22 are turned on by applying a predetermined signal to the word line WL11 as well as providing "Low" to a plate line PL11. Thus, the ferroelectric capacitor C11 is polarized to a direction in which the bit line BL11 side becomes "High" level.

Next, the signal applied to the plate line P11 is turned to "High" level. As a result of the turning, the ferroelectric capacitor C12 is polarized in a direction in which the bit line BL12 side becomes "low" level. Then, both the transistor Tr21 and Tr22 are turned to off-state by applying a predetermined signal to the word line WL11, so that the operation for writing of the switching data is completed.

In other words, both the ferroelectric capacitors C11 and C12 are polarized respectively to opposite directions by carrying out a series of the operation described in the above.

Further, operation of the switch SW11 in routine data processing is described. In other words, the operation of the switch SW11 when data to be processed is being processed is described hereinbelow. In the routine data processing, both of the bit lines BL11 and BL12 are precharged at the ground voltage by carrying out on-off switching of the transistor Tr11 and the transistor Tr12. Thereafter, both the bit lines BL11 and BL12 are turned to a high impedance state.

Next, both the transistor Tr21 and the transistor Tr22 are turned to on-state by applying a predetermined signal to the word line WL11 after turning the plate line PL11 to "Low" level, then the plate line PL11 is turned to "High" level. So that, electric charge is discharged from both of the ferroelectric capacitors C11 and C12.

The sensing amplifier AMP, which also serves as a bit line driver, amplifies a voltage generated by discharge of the electric charge on both the bit lines BL11 and BL12 to a logic level, and outputs the difference of the voltages thus amplified. Contents of the data latch DL is determined in accordance with the output, and is stored in the data latch DL.

In the example described in the above (when the ferroelectric capacitor C11 is polarized in a direction in which the bit line BL11 side becomes "High" level), more electric charge is discharged by the ferroelectric capacitor C11 than by the ferroelectric capacitor C12. So that, the bit line BL11 is amplified to "High" level and the bit line BL12 is amplified to "Low" level respectively. Therefore, the contents of the data latch DL become "High" in accordance with the output of the sensing amplifier AMP.

Thus, the AND gate 28 is in the on-state. So that, the data to be processed being inputted in the data input line L11 is transmitted to the AND input line L21 through the AND gate 28 without any change and loss. These are the operations when the switch SW 11 is in the closed state.

On the other hand, contents of the data latch DL come to "Low" when the switch SW11 is in the open state, that is in the case where the ferroelectric capacitor C11 is polarized in a direction in which the bit line BL11 side becomes "Low" level.

Thus, the AND gate 28 is in the off-state. So that, the data to be processed being inputted in the data input line L11 is cut off at the AND gate 28, and is not transmitted to the AND input line L21. Thus, it is possible to provide desired functions to the logical array 20 by switching the switch SW11 to the switch SW83 in either the open state or closed state respectively.

In the embodiment described in the above, the ferroelectric memory 26 having four of the transistors and two of the ferroelectric capacitors is described as an example of a ferroelectric memory element having a ferroelectric capacitor. The ferroelectric memory element having the ferroelectric capacitors is not limited to the ferroelectric memory 26. Other kinds of ferroelectric memory elements such as another ferroelectric memory having two transistors and two ferroelectric capacitors or the like can be applied to the present invention.

Figure 3:
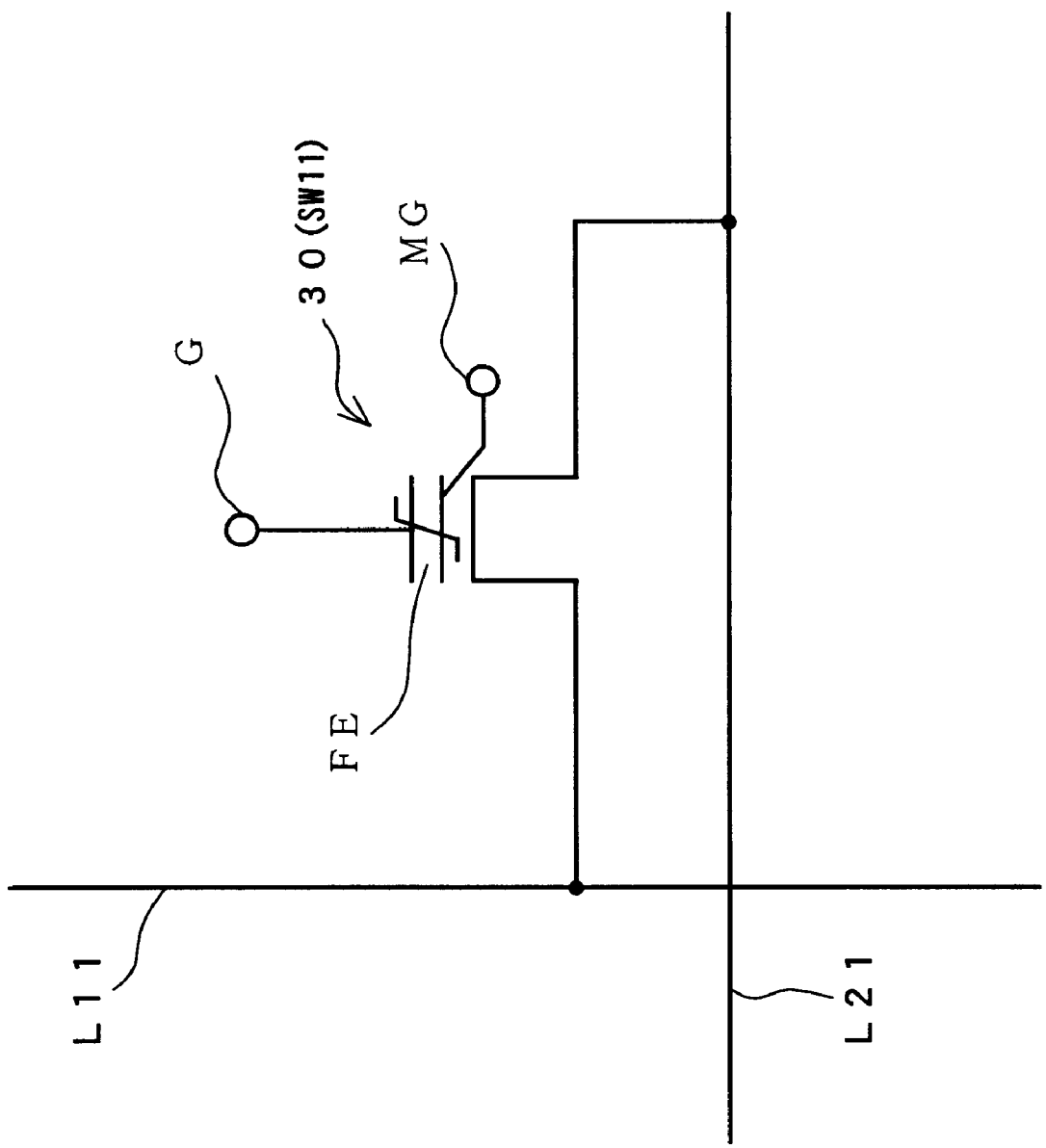
FIG. 3 is a circuit diagram of a switch used for a logical array which constructs the PLA in another embodiment of the present invention.

FIG. 3 shows a circuit diagram of a switch used for logical array 20 which constructs the PLA 12 in another embodiment of the present invention. In this embodiment, the switch SW 11 comprises a ferroelectric transistor 30.

Figure 8:
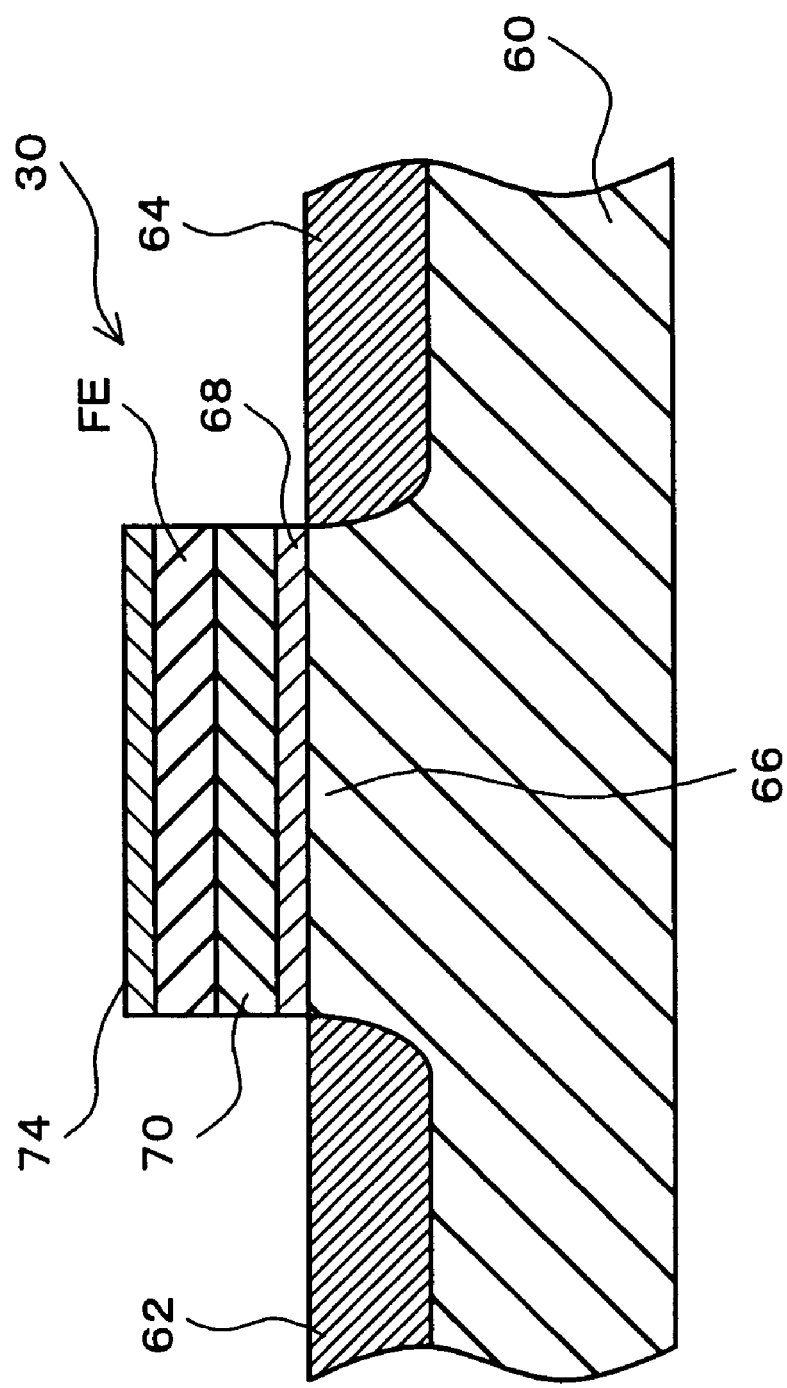
FIG. 8 is a sectional view the illustrating structure of a ferroelectric transistor which constructs the switch shown in FIG. 3.
Figure 9A:
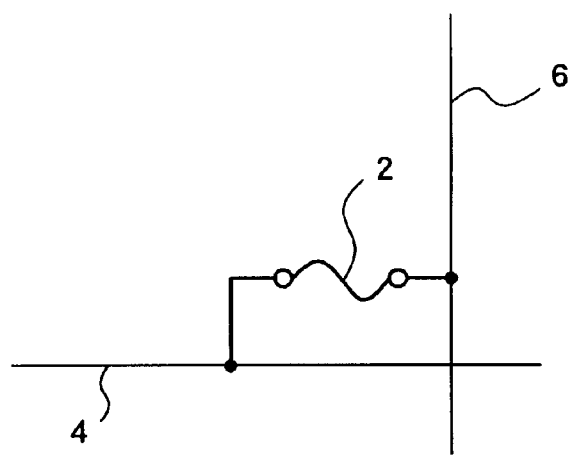
FIG. 9A is a circuit diagram of a switch used for a logical array which constructs a PLA in the prior art.
Figure 9B:
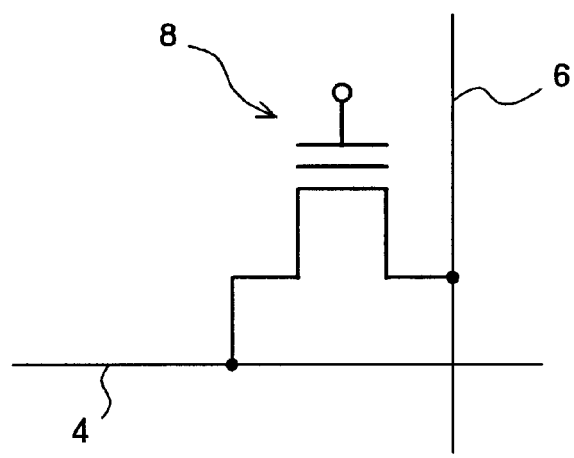
FIG. 9B is a circuit diagram of another switch used for the logical array which constructs the PLA in the prior art.
Figure 9C:
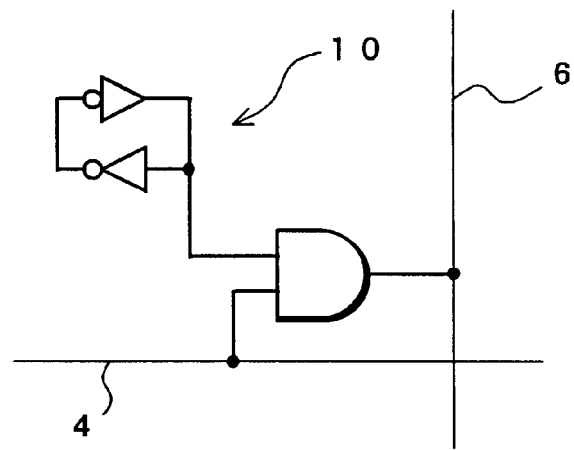
FIG. 9C is a circuit diagram of another switch used for the logical array which constructs the PLA in the prior art.

Structure of the ferroelectric transistor 30 is shown in FIG. 8. Both a source region 62 and a drain region 64 are formed in a silicon substrate 60. Also, an insulation layer 68 made of either silicon oxidation ($SiO_2$) or silicon nitrogen (SiN) is provided on a channel region 66. Further, a lower conductive layer 70 made of platinum, etc. is provided on the insulation layer 68. A ferroelectric layer FE made of lead zirconate titanate (PZT), etc. is formed thereon. Still further, an upper conductive layer 74 made of platinum, etc. is formed on the ferroelectric layer FE. Oxidized conductive materials such as RuOx, IrOx and indium tin oxide (ITO), etc. or metals such as Pb, Au, Ag, Al, and Ni, etc. can be used instead of platinum of the lower conductive layer 70 and the upper conductive layer 74.

As shown in FIG. 3 which illustrates the structure of the switch SW11 using the ferroelectric transistor 30, a gate terminal G is connected to the upper conductive layer 74, the data input line L11 is connected with the source region 62, and the AND input line L21 is connected to the drain region 64. As described later, a memory gate terminal MG can also be connected to the lower conductive layer 70.

Although the ferroelectric layer FE is polarized when a predetermined voltage is applied between the gate terminal G and the input line L11, a direction of the polarization changes in accordance with the direction of applied voltage. Value of the drain current to the gate voltage having identical value varies when a direction of the polarization is changed. By utilizing the characteristics of the ferroelectric layer FE, the switch SW11 is composed so as to generate either an open state or closed state.

Though the relationship between the direction of the voltage which is applied between the gate terminal G and the data input line L11 and the direction of polarization of the ferroelectric layer FE is not always fixed because of influences caused by other factors, at least the identical relationship can be observed between them when all the conditions are the same.

So that, for instance, the ferroelectric layer FE is polarized in a direction so as to flow a drain current against a predetermined voltage applied to the gate, when a voltage which makes the gate terminal G into a positive state against the data input line L11 is applied. The voltage condition described in the above is referred to as the closed state of the switch SW11 in this embodiment. On the other hand, the ferroelectric layer FE is polarized in a direction so as not to flow a drain current against a predetermined voltage applied to the gate, when a voltage is applied to the opposite direction. The voltage condition is referred to as the open state of the switch SW11 in this embodiment.

Thus, it is possible to rewrite the switching data of the switch SW11 by changing the direction of the voltages applied between the gate terminal G and the data input line L11.

The switch SW11 in the embodiment described above is composed so as to change the direction of the polarization for the ferroelectric layer FE by changing the direction of the voltages applied between the gate terminal G and the data input line L11. It is also possible to compose the switch SW11 so as to polarize ferroelectric layer FE in another direction by changing the direction of the voltages applied between the gate terminal G and the memory gate terminal MG. The memory gate terminal MG is formed by connecting an electrode terminal to the other opposed end of the gate terminal G of the ferroelectric layer FE (see FIG. 3).

Figure 4:
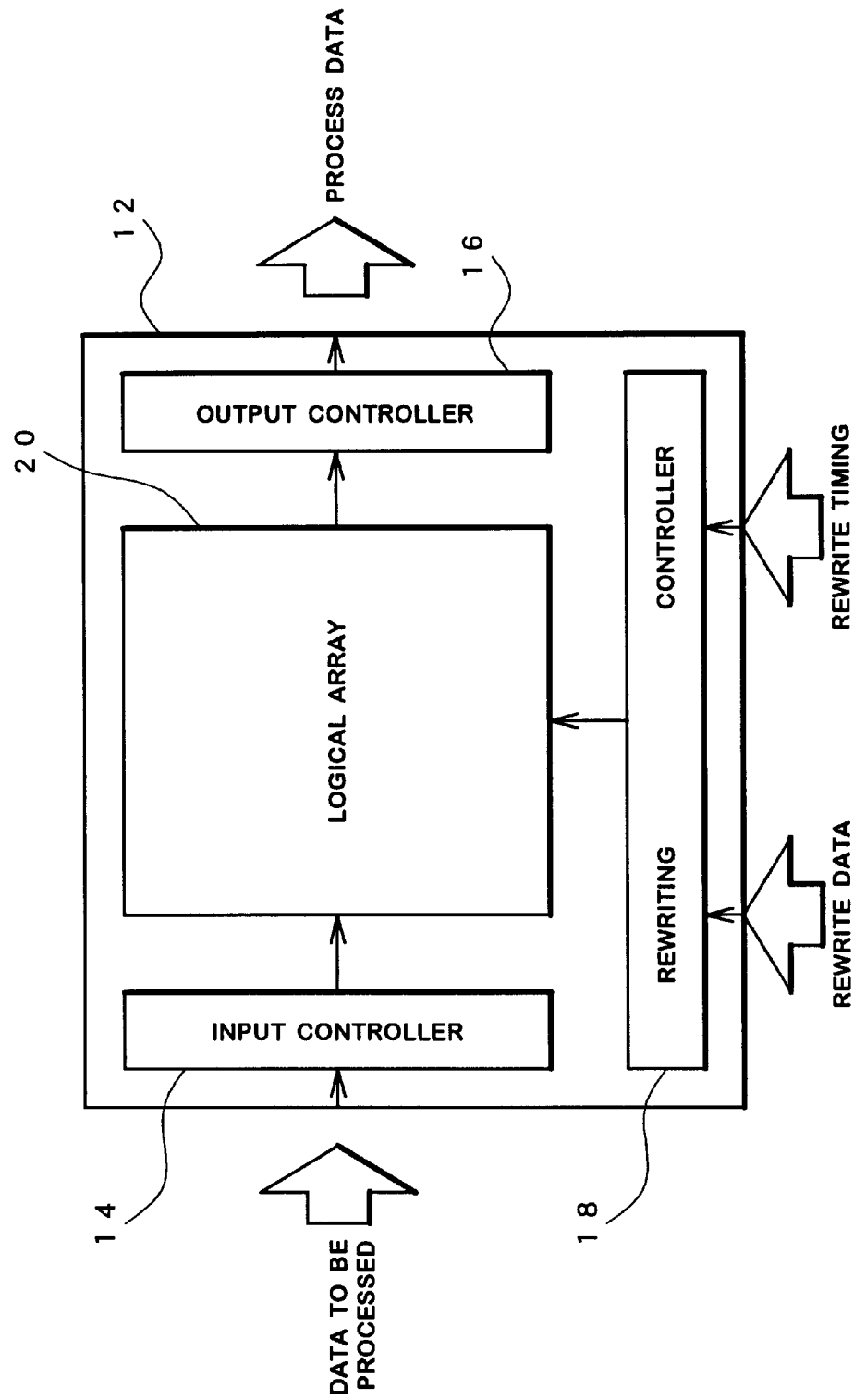
FIG. 4 is a block diagram of the PLA in an embodiment of the present invention.

Next, FIG. 4 shows a block diagram of the PLA 12 which comprises the logical array 20 shown in FIG. 2. In addition to the logic array 20, the PLA 12 further comprises an input controller 14 which serves as an input terminal for data to be processed, an output controller 16, and a rewriting controller 18 serving as both an input terminal dedicated for switching data and an input terminal dedicated for switching renewal timing.

The input controller 14 executes predetermined data processing such as serial/parallel conversion or the like to the inputted data to be processed. Then the converted data are transmitted to the logical array 20. The logical array 20 executes logic operations, etc. to the data thus transmitted with the logic circuits or the like predetermined by switching of the switch SW11, etc. Then, the output controller 16 executes predetermined data processing such as serial/parallel conversion to the data to be processed being processed by logic operations, etc. and outputs the data to be processed thus converted.

The rewriting controller 18 executes predetermined data processing such as serial/parallel conversion or the like to rewriting data inputted serving as switching data of each of the switches such as the switch SW11 to SW83. And the rewriting controller 18 also rewrites the switching data of each of the switches SW11 to switch SW83 in accordance with rewrite timing inputted as switching renewal timing.

Next, the rewriting operation of the PLA 12 shown in FIG. 4 is described hereinbelow. Once the rewriting data are inputted into the rewriting controller 18, the rewriting controller 18 executes serial/parallel conversion. Then, the data thus converted are stored into the data latch (not shown). During the conversion and the storing, the input controller 14, the logical array 20 and the output controller 16 execute routine logic operations or the like which are regularly done to the data to be processed separately from the data processing executed by the rewriting controller 18.

Thereafter, once the rewrite timing is inputted into the rewriting controller 18, the rewriting controller 18 rewrites the switching states of the switches SW11 to SW83 in accordance with the rewriting data stored in the data latch. Thus, the logic circuits of the logical array 20 can be switched to another logic circuit at arbitrary timing.

Figure 5:
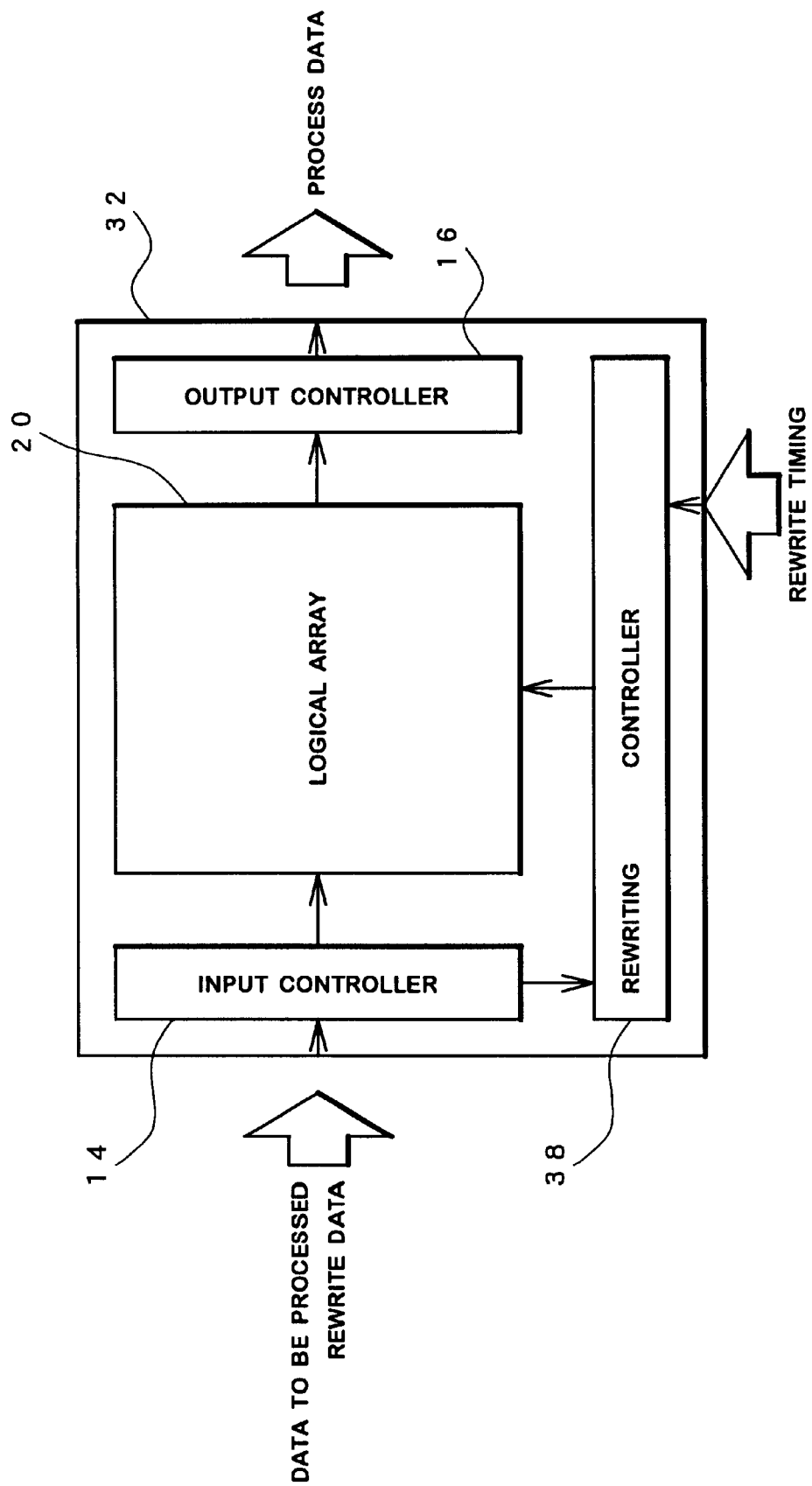
FIG. 5 is a block diagram of the PLA in another embodiment of the present invention.

Next, FIG. 5 shows a block diagram of a PLA 32 as another embodiment of the present invention. The PLA 32 has a different structure from the PLA 12 shown in FIG. 4 in view of not comprising the input terminal dedicated switching data. All the other structures of the PLA 32 are identical with the PLA 12.

The rewriting data are inputted through the input controller 14 instead of inputting the data to be processed on demand. A rewriting controller 38 recognizes that the data inputted into the input controller 14 are the rewriting data by inputted rewrite timing, so that the rewriting data is retrieved to the rewriting controller 38. The logic circuit of the logical array 20 can be switched to another logic circuit in accordance with the rewriting data thus retrieved. By composing the PLA 32 as described above, the logic circuit of the logical array 20 can be switched in another circuit without comprising the input terminal dedicated for switching data.

Although, the PLA 32 in the embodiment shown in FIG. 5 is composed so that the rewriting controller 38 recognizes the data inputted into the input controller 14 as the rewriting data by the rewrite timing inputted to the rewriting controller 38, it is possible to compose the PLA 32 to input the reading timing separately from input of the rewrite timing.

In that case, the rewriting controller 38 recognizes that the data inputted into the input controller 14 is the rewriting data by the inputted reading timing, so that the rewriting data are retrieved into the rewriting controller 38, and the rewriting data are stored into the data latch. Thereafter, the logic circuit of the logical array 20 is switched to another logic circuit in accordance with the rewriting data thus stored by the rewriting controller 38 when the rewrite timing is inputted into the rewriting controller 38.

Also, in the embodiment shown in FIG. 5, the PLA 32 can be composed so that the input controller 14 judge, whether the inputted data in it are either the data to be processed or the rewriting data by setting a specific bit of the inputted data as a flag for judgement.

Figure 6:
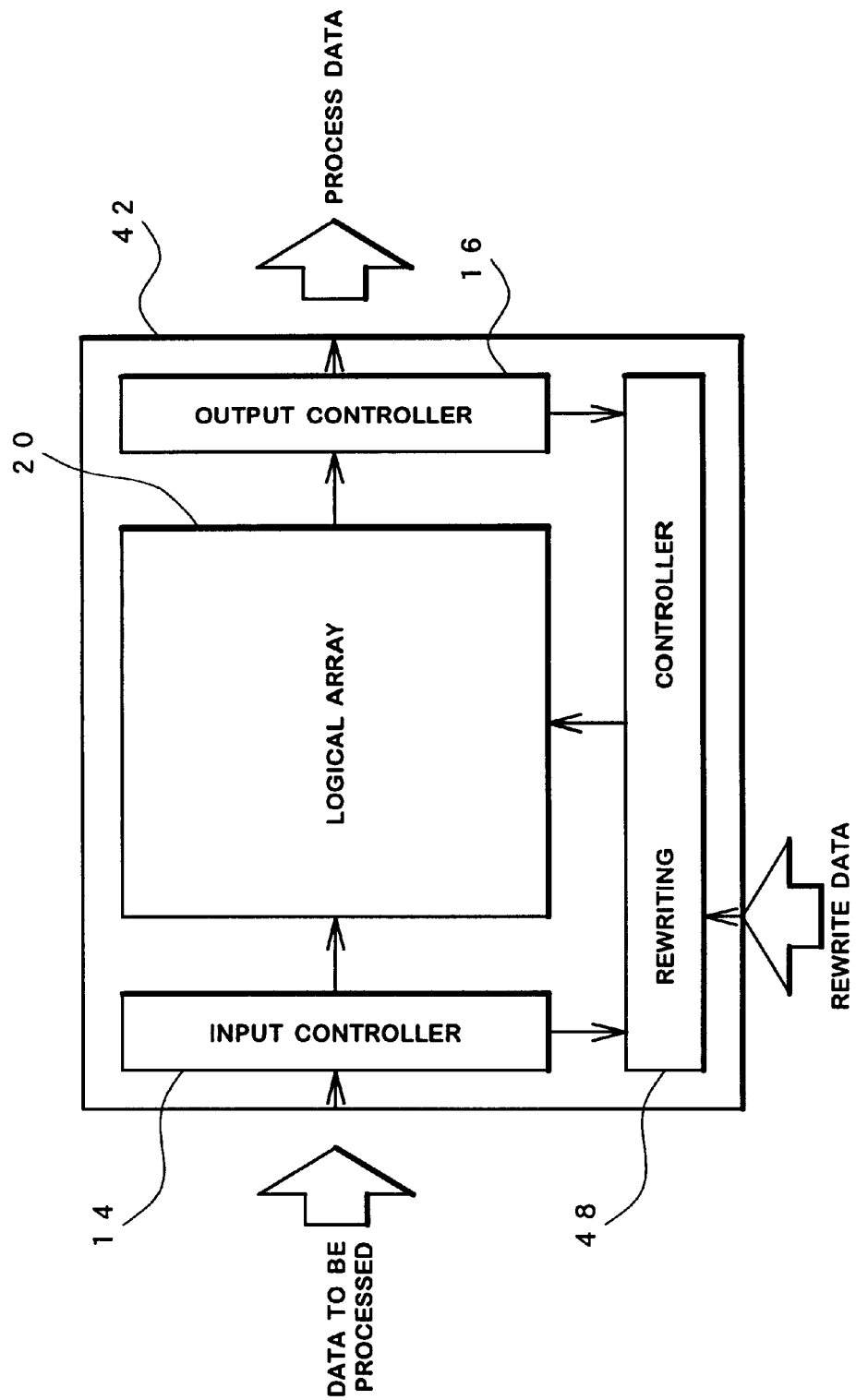
FIG. 6 is a block diagram of the PLA in far another embodiment of the present invention.

Next, FIG. 6 shows a block diagram of a PLA 42 as far another embodiment of the present invention. The PLA 42 has a different structure from the PLA 12 shown in FIG. 4 in view of not comprising the input terminal dedicated for switching renewal timing. All the other structures of the PLA 42 are identical with the PLA 12.

A rewriting controller 48 monitors input of the rewriting data, and switches the logic circuit of the logical array 20 to another logic circuit in accordance with the rewriting data thus retrieved on completion of the series of input of the rewriting data. In other words, the PLA 42 is composed so as to generate the rewrite timing by itself. By composing the PLA 42 as described above, the logic circuit of the logical array 20 can be switched to another circuit without comprising the input terminal dedicated for switching renewal timing.

Figure 7:
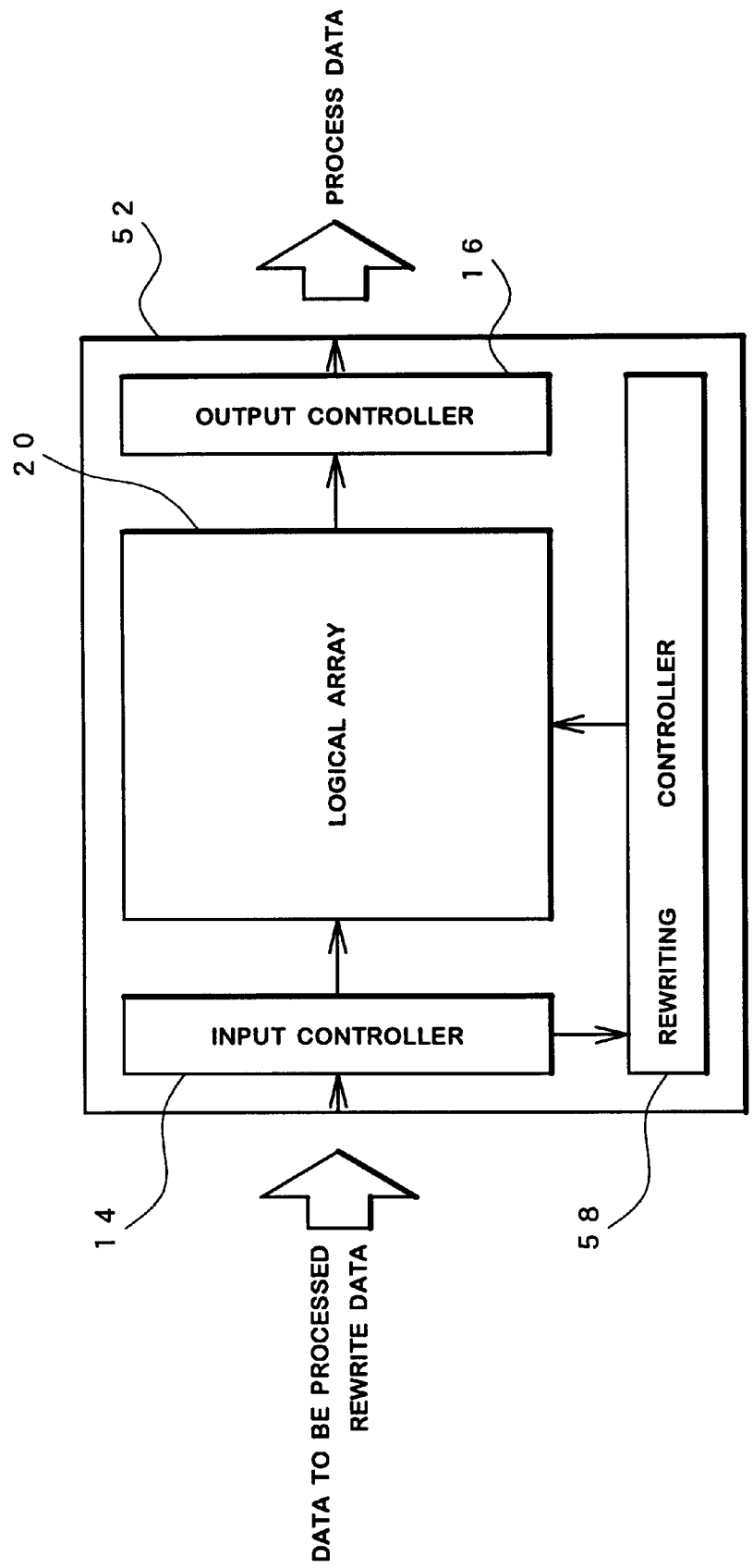
FIG. 7 is a block diagram of the PLA in still another embodiment of the present invention.

Next, FIG. 7 show a block diagram of a PLA 52 as still another embodiment of the present invention. The PLA 52 has a different structure from the PLA 12 shown in FIG. 4 in view of not comprising both the input terminal dedicated for switching data and the input terminal dedicated for switching renewal timing. All the other structures of the PLA 42 are identical with the PLA 12.

The rewriting data are inputted through the input controller 14 instead of inputting the data to be processed on demand. A specific bit of inputted data in the input controller 14 is set as a flag for judgement. A rewriting controller 58 judges whether the inputted data are either of the data to be processed or the rewriting data by monitoring the specific bit of the inputted data in the input controller 14. The inputted data are retrieved into the rewriting controller 58 when it is judged to be the rewriting data.

On the other hand, the rewriting controller 58 switches the logic circuits of the logical array 20 to another logic circuit in accordance with the rewriting data thus retrieved on completion of the series of input of the rewriting data. By composing the PLA 52 as described in the above, the logic circuit of the logical array 20 can be switched to another circuit without comprising both the input terminal dedicated for switching data and the input terminal dedicated for switching renewal timing.

Although, in each of the embodiments described above, the ferroelectric memory element having the ferroelectric capacitor and the ferroelectric transistor are described as examples of the memory element having ferroelectric material, the memory element having ferroelectric material is not limited to the ferroelectric memory element having the ferroelectric capacitor and the ferroelectric transistor.

Although, the PLA, a kind of PLD, is described as an example of a programmable functional device, the present invention can also be applied to FPGA which is another kind of PLD. Further, application of the present invention is not limited to the PLD, it is possible to apply present invention to all the programmable functional devices.

The present invention is characterized in that the programmable functional device uses a memory element having ferroelectric material as the switching means. So that, rewriting which cannot be done by utilizing a fuse as the switching means, is able tube carried out by the programmable functional device. Also, the time required for rewriting can be shorten, because rewriting can be done only by polarizing the ferroelectric material. Therefore, it is not necessary to use the two tiles exclusively as EEPROM does. The polarization state of the ferroelectric material is maintained even when the power is turned off. Therefore, it is not necessary to provide another non-volatile memory device to secure contents of the rewriting separately, as the SRAM does. In other words, it is possible to realize a programmable functional device in compact profile which maintains rewriting data, and enables rewriting of the logic functions under real-time bases.

Also, the present invention is characterized in that an input terminal dedicated for switching data is comprised in the programmable functional device. So that, input of switching data can be carried out in parallel with execution of data processing for the data to be processed. Therefore, suspension of data processing does not occur when the switching data are inputted. In other words, decline of data processing efficiency can be minimized further when rewriting of the logic functions is carried out under real-time bases.

Further, the present invention is characterized in that, switching data of the switching means are inputted through the input terminal for data to be processed. So that, it is not necessary to provide another input terminal for inputting the switching data separately. In other words, a programmable functional device having more compact profile can be realized.

Still further, the present invention is characterized in that the input terminal dedicated for switch renewal timing is comprised in the programmable functional device. So that, it is possible to renew the switching state of the switching means at a desired timing. Therefore, rewrite functions can be carried out at an optimum timing which corresponds with data processing for the data to be processed. In other words, decline of data processing efficiency can be minimized further when rewriting of the logic functions is carried out under real-time bases.

The present invention is characterized in that renewal timing is generated by the programmable functional device. So that, it is not necessary to provide another input terminal for inputting the renewal timing separately. In other words, a programmable functional device having more compact profile can be realized.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A programmable functional device comprising:
   a plurality of circuit elements preliminarily arranged and being connected to one another through a switching means capable of programming, the programmable functional device obtaining desired functions by switching the switching means, the switching means including a memory element with a ferroelectric material, an input terminal for data to be processed provided for inputting the data to be processed in accordance with the desired functions, and an input line and input terminal dedicated for switching data for inputting switching data to the switching means having the ferroelectric material.

2. A programmable functional device in accordance with claim 1, wherein an input terminal for data to be processed is provided for inputting the data to be processed in accordance with the desired functions, and wherein switching data of the switching means are inputted through the input terminal for data to be processed.

3. A programmable functional device in accordance with claim 2, wherein the programmable functional device is a programmable logic device comprises a logical array, and wherein the input terminal for data to be processed serves as an input controller which receives input of the data to be processed and transmits the data to be processed to the logical array after carrying out predetermined data processing to the data to be processed inputted into the input terminal for data to be processed, and the input controller receives input of the switching data of the switching means instead of the data to be processed on demand.

4. A programmable functional device in accordance with claim 1, further comprising:

an input terminal dedicated for switching renewal timing for inputting switching renewal timing in order to renew switching state of the switching means in accordance with switching data of the switching means.

5. A programmable functional device in accordance with claim 4, wherein the programmable functional device is a programmable logic device which comprises a logical array, and wherein the input terminal dedicated for switching renewal timing serves as a rewriting controller which receives input of the switching renewal timing and executes rewriting of the switching data of the switching means in accordance with the switching renewal timing inputted into the input terminal dedicated for switching renewal timing.

6. A programmable functional device in accordance with claim 1, wherein renewal timing which renews switching state of the switching means in accordance with switching data of the switching means is generated by the programmable functional device.

7. A programmable functional device in accordance with claim 6, further comprising:

a rewriting controller for monitoring input of the switching data, and for executing rewrite of the switching data of the switching means upon completion of input of the switching data.

8. A programmable functional device in accordance with claim 1, wherein a ferroelectric memory element having a ferroelectric capacitor is used as a memory element having ferroelectric material.

9. A programmable functional device in accordance with claim 8, wherein the ferroelectric memory element having the ferroelectric capacitor comprises a pair of ferroelectric capacitors exhibit opposite polarization state with each other.

10. A programmable functional device in accordance with claim 1, wherein a ferroelectric transistor is used as a memory element having ferroelectric material.

11. A programmable functional device in accordance with claim 10, wherein the ferroelectric transistor is a field effect type transistor which connects a ferroelectric capacitor to a gate terminal in series.

12. A programmable functional device in accordance with claim 10, wherein the ferroelectric transistor comprising:

a source region, a drain region, a channel region formed between the source region and the drain region, a lower conductive layer formed on the channel region being insulated therefrom, a ferroelectric layer formed on the lower conductive layer, an upper conductive layer formed on the ferroelectric layer, a gate terminal connected to the upper conductive layer.

13. A programmable functional device in accordance with claim 12, wherein a memory gate terminal is connected to the lower conductive layer of the ferroelectric transistor, and wherein polarization state of the ferroelectric capacitor is varied in accordance with a direction of voltage applied between the gate terminal and the memory gate terminal.

14. A programmable functional device in accordance with claim 1, wherein the programmable functional device is a programmable logic device comprises a logical array.

15. A programmable functional device in accordance with claim 14, wherein the logical array further comprising:

an AND portion having at least one AND gate, and an OR portion having at least one OR gate.

16. A programmable functional device in accordance with claim 1, wherein the programmable functional device is a programmable logic device comprises a logical array, and wherein the input terminal for data to be processed serves as an input controller which receives input of the data to be processed and transmits the data to be processed to the logical array after carrying out predetermined data processing to the data to be processed inputted in the input terminal for data to be processed, and wherein the input terminal dedicated for switching data serves as a rewriting controller which receives input of the switching data and executes rewriting of the switching data of the switching means in accordance with predetermined rewrite timing after carrying out predetermined data processing to the switching data inputted into the input terminal for data to be processed.

* * * * *